United States Patent [19]

Donaghey

[11] 4,366,336

[45] Dec. 28, 1982

[54] AGE AND HEAT STABILIZED PHOTOVOLTAIC CELLS

[75] Inventor: Lee F. Donaghey, Berkeley, Calif.

[73] Assignee: Chevron Research Company, San Francisco, Calif.

[21] Appl. No.: 197,414

[22] Filed: Oct. 16, 1980

[51] Int. Cl.³ .................... H01L 31/06; H01L 31/18
[52] U.S. Cl. .................................. 136/256; 136/260;
 136/264; 136/265; 136/252; 29/572; 427/74;
 427/88; 357/30; 357/67
[58] Field of Search .............. 136/252, 256, 260, 262,
 136/264, 265, 244; 29/572; 427/74, 88; 357/30, 67

[56] References Cited

U.S. PATENT DOCUMENTS

| | | | |
|---|---|---|---|
| 4,086,101 | 4/1978 | Jordan et al. | 136/258 PC |
| 4,143,235 | 3/1979 | Duisman | 136/258 PC |
| 4,260,428 | 4/1981 | Roy | 136/260 |
| 4,267,398 | 5/1981 | Rothwarp | 136/256 |
| 4,287,383 | 9/1981 | Peterson | 136/260 |
| 4,328,390 | 5/1982 | Meakin et al. | 136/259 |

OTHER PUBLICATIONS

M. S. Tomar et al., "A Comparative Study of $Cu_2$-S—$Zn_xCd_{1-x}S$ and $Cu_2S$—CdS Thin Film Solar Cells Prepared by Solid State Reaction", *Japanese J. Appl. Phys.*, vol. 19, (1980), Supplement 19-1, pp. 567–571.

M. S. Tomar et al., "A Comparative Study of $Cu_2$-S—$Zn_xCd_{1-x}S$ and $Cu_2S$—CdS Thin Film Solar Cells Prepared by Solid State Reaction", *Digest of Technical Papers, 11th Conf. on Solid State Devices*, Tokyo, (1979), pp. 233–234.

*Primary Examiner*—Aaron Weisstuch
*Attorney, Agent, or Firm*—D. A. Newell; E. J. Keeling; A. S. Zavell

[57] ABSTRACT

Improved age and heat stabilized photovoltaic solar cells comprising a semiconducting layer, a barrier layer containing the metal $M_1$ and a stabilizing metal electrode containing two or more metals, one of which is $M_1$, such that the tendency for $M_1$ to diffuse between the electrode and the barrier layer is approximately zero.

20 Claims, 3 Drawing Figures

SOLAR ILLUMINATION

AGE AND HEAT STABILIZED PHOTOVOLTAIC CELLS

BACKGROUND OF THE INVENTION

Field of the Invention

The present invention relates to age and heat stabilized photovoltaic solar cells. More particularly, the invention relates to heterojunction photovoltaic cells having a stabilizing metal electrode.

The preparation of thin film photovoltaic cells is well known. However, a great deal of research effort is still expended in the development and improvement of photovoltaic cells in order to provide greater cell efficiency and economic feasibility. In particular, there is a continuing need for improvement of the age and heat stability of heterojunction photovoltaic cells such as cadmium sulfide photovoltaic cells.

Solar cells prepared from CdS as well as other solar cells prepared from compound semiconductors are known to degrade during operation. The degradation in cell efficiency is thought to occur by thermally activated diffusion. The $Cu_xS$-CdS solar cell is particularly sensitive to degradation through thermal effects. $Cu_xS$ indicates a copper sulfide composition wherein the value of x is in the range of 1.95 to 2.0. The thermal and age degradation of this cell is thought to be caused by diffusion of copper from the $Cu_xS$ layer into the CdS layer, and to changes in the composition of the $Cu_xS$ layer.

When the $Cu_xS$-CdS solar cell is fabricated from thin films, without any subsequent heat treatment, the cell has a low efficiency owing to a low open circuit voltage and a poor I-V curve. A heat treatment of such cells has been found to improve the efficiency, and this heat treatment is now conventionally used in the preparation of such cells. For example, T. S. te Velde and J. Dieleman (Phillips Res. Reports 28,573 (1973)), using single crystal CdS, found that oxygen and hydrogen heat treatments influence the efficiency of the $Cu_xS$-CdS cell.

A. Rothwarf (2nd E. C. Photovoltaic Solar Energy Conference, R. Van Overstraelen and W. Palz, Eds., Reidel Publ. Co., 1979, page 370) has reported that hydrogen and air (oxygen) heat treatments modify the conductivity of the $Cu_xS$ layer, and that the optimum conductivity corresponds to $Cu_xS$ with x in the range from 1.9995 to 1.99995.

W. J. Biter (Solar Energy, J. B. Berkowitz and I. A. Lesk, Eds., Electrochem. Soc., Princeton, N.J. P. 337 (1976)) has shown that thin films of metal evaporated onto the $Cu_xS$ layer after heat treatment cause a change in the efficiency of the cell. For example, a thin layer of copper improved the cell efficiency, whereas thin layers of Au, Ag, Zn, Cd, Al, In, Ni and Sn caused a decrease in the cell efficiency. These changes were thought to be caused by diffusion of the evaporated metal through the $Cu_xS$ layer, causing a change at the heterojunction interface.

SUMMARY OF THE INVENTION

Photovoltaic cells of improved stability are provided comprising a barrier layer containing the metal $M_1$, one facial surface of said barrier layer in contact with a layer of semiconductor material and forming a photovoltaic heterojunction therewith, and a stabilizing metal electrode in intimate contact with at least a portion of the other facial surface of said barrier layer; wherein said stabilizing metal electrode is comprised of at least two metallic elements, one of which is $M_1$, such that the tendency of $M_1$ to diffuse between said stabilizing metal electrode and said barrier layer is approximately zero.

BRIEF DESCRIPTION OF THE DRAWINGS

The nature of the improved photovoltaic cells of the present invention will be more readily understood when taken into consideration with the accompanying drawings.

DETAILED DESCRIPTION OF PREFERRED EMBODIMENTS OF THE INVENTION

Figure 1:
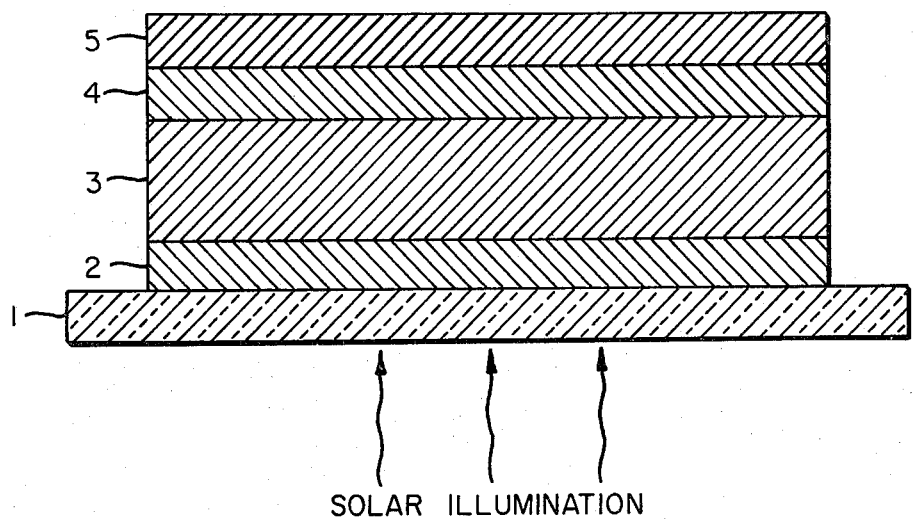
FIG. 1 shows a schematic cross-sectional view of a photovoltaic cell of the "backwall" type. In this cell the light enters through the substrate and passes through the conducting electrode and the semiconductor layer.

The present invention applies to all solar cells which contain a diffusing metallic element in one of the semiconducting layers of the solar cell, in particular, those cells comprising successively a semiconductor electrode layer, a compound semiconductor layer, a metal-containing barrier layer and a barrier electrode. The diffusing metallic element is referred to herein as $M_1$. In embodiments of this invention, $M_1$ is present in both the barrier layer and the barrier electrode. However, if the tendency of $M_1$ to diffuse from the barrier electrode into the barrier layer is approximately zero, the barrier electrode is called a "stabilizing electrode". It should be recognized that at equilibrium, although the tendency of $M_1$ to diffuse between the stabilizing electrode and the barrier layer is zero, there are actually as many $M_1$ atoms diffusing from the stabilizing electrode into the barrier layer as there are $M_1$ atoms diffusing from the barrier layer into the stabilizing electrode. Therefore, by "tendency to diffuse being approximately zero" is meant approximately zero net transfer of $M_1$ across the interface between the stabilizing electrode and the barrier layer, i.e., the net diffusion of $M_1$ between the electrode and the barrier layer is approximately zero.

A convenient measure of the tendency of $M_1$ to diffuse between layers is the difference in chemical potential of $M_1$ between those layers. In embodiments of the present invention, the difference in chemical potential of $M_1$ between the stabilizing electrode and the barrier layer will be approximately zero at a given temperature and so will the tendency for $M_1$ to diffuse between same. We assume the temperature, T, is the same in the barrier layer and the electrode. To within a constant, the chemical potential of species $M_1$ in the ith layer is $RT \ln a_i$, and in the jth layer is $RT \ln a_j$, where $a_i$ and $a_j$ are the activities of $M_1$ in the ith and jth layers and R is the gas constant. Consequently, we may express the condition for embodiments of the present invention as $a_i = a_j$, i.e., the activities of $M_1$ are the same in both the stabilizing electrode and the barrier layer. It has not heretofore been realized that the critical stoichiometry of $M_1$ in the barrier layer should be stabilized by the choice of a barrier electrode containing $M_1$ at the same activity as the activity of $M_1$ in the barrier layer at its critical stoichiometry, hence a stabilizing electrode.

The activities of a given constituent of two layers, or phases, are equal at equilibrium (the activities being referred to the same standard state, S. Glasstone, *Thermodynamics for Chemists*, D. Van Nostrand, New York, 1947). The standard state for the metal $M_1$ is the pure solid, and the value of its activity in the standard state is unity. There are many ways of measuring the activity of a species such as $M_1$ in the stabilizing electrode and barrier layer, several of which are mentioned hereinbelow, i.e., thermodynamic measurements (S. Glasstone, cited, Page 363, illustrates the determination of the activity of one metal dissolved in another, e.g., a liquid alloy, by EMF measurements of the appropriate cell).

The barrier layer in cells of this type is generally prepared from compounds formed from the elements of Groups IB (e.g., Cu), IIB (e.g., Zn), IIIA (e.g., Ga), IIIB (e.g., Sc), VIB (e.g., Cr) in combination with the elements of Groups IVA (e.g., Ge), IVB (e.g., Ti), VA (e.g., As), VB (e.g., V) and VIA (e.g., Se). For example, compounds of Groups VIB (e.g. Mo), and VIA (e.g., Te); IIIB (e.g., Y) and VA (e.g., Bi); IIB (e.g., Cd) and VA (e.g., As); IB (e.g., Ag), IVA (e.g., Si) and VIa (e.g., S); IB (e.g., Au), IIIB (e.g., La) and VB (e.g., V); and similar combinations.

The compound semiconductors for the semiconductor layer are well known and are made from combinations of the conductor metal elements and non-metal elements. The conductor metals useful for this purpose are selected from the elements strontium, barium, copper, silver, manganese, iron, cobalt, nickel, tin, antimony, lead, bismuth, and the elements of Groups IIB (e.g., Cd), IIIA (e.g., In), IIIB (e.g., Sc), IVB (e.g., Ti), VB (e.g., V), and VIB (e.g., Cr). Useful non-metallic elements for combination with the above metals include silicon, germanium, phosphorus, arsenic, sulfur, selenium, tellurium, and the like. For example, compounds of Group IIB (e.g., Zn) and sulfur, Group IIIA (e.g., Al) and arsenic, Group IIIB (e.g., La) and selenium, and similar combinations. In particular, the invention applies to the following solar cells, wherein X is the barrier layer and Y is the semiconductor layer.

$$X = Cu_xS,$$
$$CdTe—Cu_xTe$$
$$Cu_xInSe_2$$
$$Cu_xInTe_2$$
$$Cu_xGaTe_2$$
$$Cd_xSiAs_2$$
$$Zn_xSiAs_2$$
$$B_xAs; \text{ and}$$
$$Y = CdS$$
$$Zn_xCd_{(1-x)}S$$
$$In_2O_3:Sn$$
$$SnO_2:Sn$$
$$Zn_3P_2$$

The diffusing element $M_1$ in the present invention is any element which diffuses between the barrier electrode and the barrier layer with sufficient rapidity at some temperature to effect the performance, efficiency or stability of the photovoltaic cell. Such diffusing elements are normally metallic elements, illustrated hereinabove by the enumerated metallic elements of the barrier layer, e.g., Cu, Ag, Zn, Cd, Ga, In, Sc, Y, La, Cr, Mo, etc. Preferably, $M_1$ is selected from metals of the Groups IB, IIB, IIIA and B, IVA and B, VB and VIB; more preferably, from among strontium, barium, tin, lead, antimony, bismuth, manganese and the Group IB, IIB, IIIA and B, IVB, VB and VIB metals; and most preferably, from copper, zinc and boron. While the invention applies to rapidly diffusing elements other than copper, copper is used herein to illustrate the invention, because of its presence in the important and well-studied $Cu_xS$-CdS cell. Such a cadmium sulfide cell preferably has $M_1$ selected from metal elements of Groups IB, IIB, IIIA and B, and IVB.

In a preferred embodiment, the barrier electrode is a stabilizing electrode comprising a two-phase mixture of two or more metallic compositions which are solid solutions or intermetallic compounds. Among other factors, this embodiment is based on the fact that by a coexistence of phases, the activity of $M_1$ contained in the stabilizing metal electrode is maintained at a preselected value. In practice, the activity of $M_1$ in the stabilizing metal electrode is chosen to equal the activity of $M_1$ in the barrier layer. The value of the activity in the stabilizing electrode is fixed by the nature of the other components and by their relative concentrations in relation to $M_1$.

The preferred stabilizing metal electrodes of this invention are two-phase mixtures of two or more metallic compositions which are solid solutions or intermetallic compounds. The term "alloy" as used herein encompasses both solid solutions and intermetallic compounds. For use in such embodiments of the invention, the stabilizing electrode must have the following properties:

(1) The alloying element or elements must form solid solutions or intermetallic compounds with the metal $M_1$ that is common to the alloy and the barrier layer;

(2) The resulting electrode must be electrically conductive;

(3) The alloying element or elements will preferably not compete for other elements in the barrier layer. For example, in the $Cu_xS$-CdS cell, the alloying element should not form a sulfide by reacting with the sulfur from the $Cu_xS$ layer.

Furthermore, it is preferred that the alloying element or elements form two compounds with the metal $M_1$ common to the barrier layer, which then act together or "coexist" to stabilize the activity of the common metal. Examples of binary systems useful for this invention include: copper-zinc, copper-aluminum, copper-tin, copper-gold, zinc-cadmium, zinc-silver, zinc-tin, and the like.

The stabilizing electrode may have more than two components, and ternary compositions are also useful in maintaining a constant activity. Examples of ternary compositions useful herein include: copper-nickel-aluminum, copper-zinc-tin, zinc-cadmium-gold, etc.

The actual activity value necessary for any given system of barrier layer and stabilizing electrode varies from system to system, but is in the range of $1 \times 10^{-7}$ to $5 \times 10^{-1}$ for Cu in the CdS-$Cu_xS$ cell. This choice of activity for Cu in the stabilizing electrode will serve to stabilize the critical stoichiometry of Cu in the barrier layer at greater than 1.99 and less than 2.0, i.e., $x = 1.996-1.999$, in $Cu_xS$.

For solid solutions, the activity can be approximated by concentration. For intermetallic compounds with a small range of variable composition, the component activities can be approximated by linear functions of composition. Actual activity values for many compositions are already known and are reported in the literature. Experimentally, the activity may be determined by measuring the electromotive force of the mixture against the pure element. A pure element has an activity of 1 (standard state).

Activity values of copper in various alloys and intermetallic compounds are obtainable from the literature or from experimentation. In the latter case, vapor pressures or electromotive force measurements on the compound as compared to the pure element are employed. Typical elements that can be alloyed or combined with copper to produce layers having the desired activity in accordance with the preferred embodiment of this invention include the metallic elements of Groups IIB, IIIA and IIIB, and IVA (other than Pb) of the Periodic Table, for example, zinc, tin, indium, gallium, aluminum, etc.

Specifically, I have found that cadmium sulfide photovoltaic cells of improved stability are provided comprising successive layers of transparent conducting electrode, cadmium sulfide semiconductor, copper sulfide barrier and stabilizing copper metal electrode, said copper metal electrode comprising copper, copper alloys, or mixtures thereof, in which the copper has a standard chemical activity in the range of $1 \times 10^{-7}$ to $5 \times 10^{-1}$. The chemical activity of copper in $Cu_xS$ is a very sensitive measure of composition. Thus, an activity of about $1 \times 10^{-5}$ corresponds to an x value of 1.996 and an activity of about 0.5 corresponds to an x value of 1.999.

The stabilizing electrode may be formed by evaporating onto the $Cu_xS$ layer an alloy layer containing a stable, constant standard chemical activity of copper. Thus, in an embodiment of the invention, we deposit onto the $Cu_xS$ layer a copper alloy layer or grid which contains a two-phase mixture of copper compounds. In chemical equilibrium, the two-phase mixture exhibits a chemical activity of copper which does not change. An alternate, but less preferred method of embodying the invention, is to deposit onto the $Cu_xS$ layer a copper alloy layer or grid which is a solid solution. Another alternate method, but less preferred, is to deposit onto the $Cu_xS$ layer a copper alloy layer which is a copper intermetallic compound. An alternate method, but less preferred, is to deposit onto the $Cu_xS$ layer a series of thin films, one of which is copper, and to heat these layers to form one or more copper solid solutions or intermetallic compounds.

Other materials may be advantageously incorporated in the various layers of the photovoltaic cells. For example, small amounts of the element or elements of the conducting layer may be incorporated into the semiconducting layer to improve adhesion as disclosed in companion U.S. application Ser. No. 27,979 of the present inventor, now U.S. Pat. No. 4,234,353. Also, "dopants" may be added to the semiconducting layer to reduce the internal resistivity of the semiconducting layer. An illustration of this is found in the aforementioned U.S. Pat. No. 3,880,633, which discloses the addition of an aluminum-containing compound to the semiconductor cadmium sulfide layer.

DETAILED DESCRIPTION OF THE DRAWINGS

Referring to FIG. 1, a thin film polycrystalline photovoltaic cell of the "backwall" type is shown. Light enters through substrate 1, which is a transparent material such as glass. The light then enters the conducting electrode 2. This electrode is chemically inert and able to withstand high temperatures. It is also transparent to the wavelengths to which the photovoltaic junction is sensitive. Suitable transparent metal conducting electrodes include stannic oxide containing antimony, cadmium stannate, and indium oxide containing tin. The light then enters the semiconductor layer 3, for example, a cadmium sulfide layer. Following this, the light proceeds into barrier layer 4. This barrier layer, which completes the photovoltaic junction with the semiconductor layer, is a microscopically thin film of about 0.01 to 0.1 micron in thickness of a material containing the metals previously described. For example, such a barrier layer may be a copper compound, such as copper sulfide. The final layer 5 of the photovoltaic cell illustrated in FIG. 1 is the stabilized metal electrode of the present invention.

Figure 2:
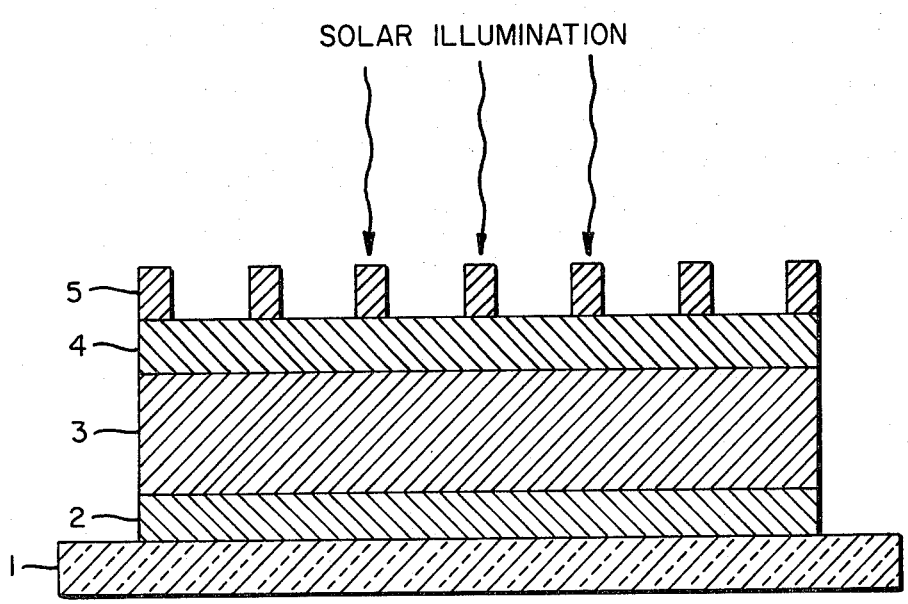
FIG. 2 shows a schematic cross-sectional view of a photovoltaic cell of the "frontwall" type in which the light enters through the stabilized metal electrode grid and passes through the barrier layer and the semiconductor layer.

Referring to FIG. 2, a thin film polycrystalline photovoltaic cell of the "frontwall" type is shown. The light enters through the stabilizing metal electrode grid 5. The light then enters the barrier layer 4, following which is the semiconductor layer 3 and electrode layer 2. The aforementioned layers are imposed on substrate 1, which may be glass or metal or concrete. In an alternate form of "frontwall" cell, the grid electrode may be ordinary metal, and the stabilizing metal electrode may be next to the substrate. Also, in this alternative "frontwall" cell, the semiconductor layer and barrier layer may be reversed so that the semiconductor layer is next to the metal grid electrode. In both FIG. 1 and FIG. 2, the electrode layers or grids are connected to appropriate electrical circuits.

Figure 3:
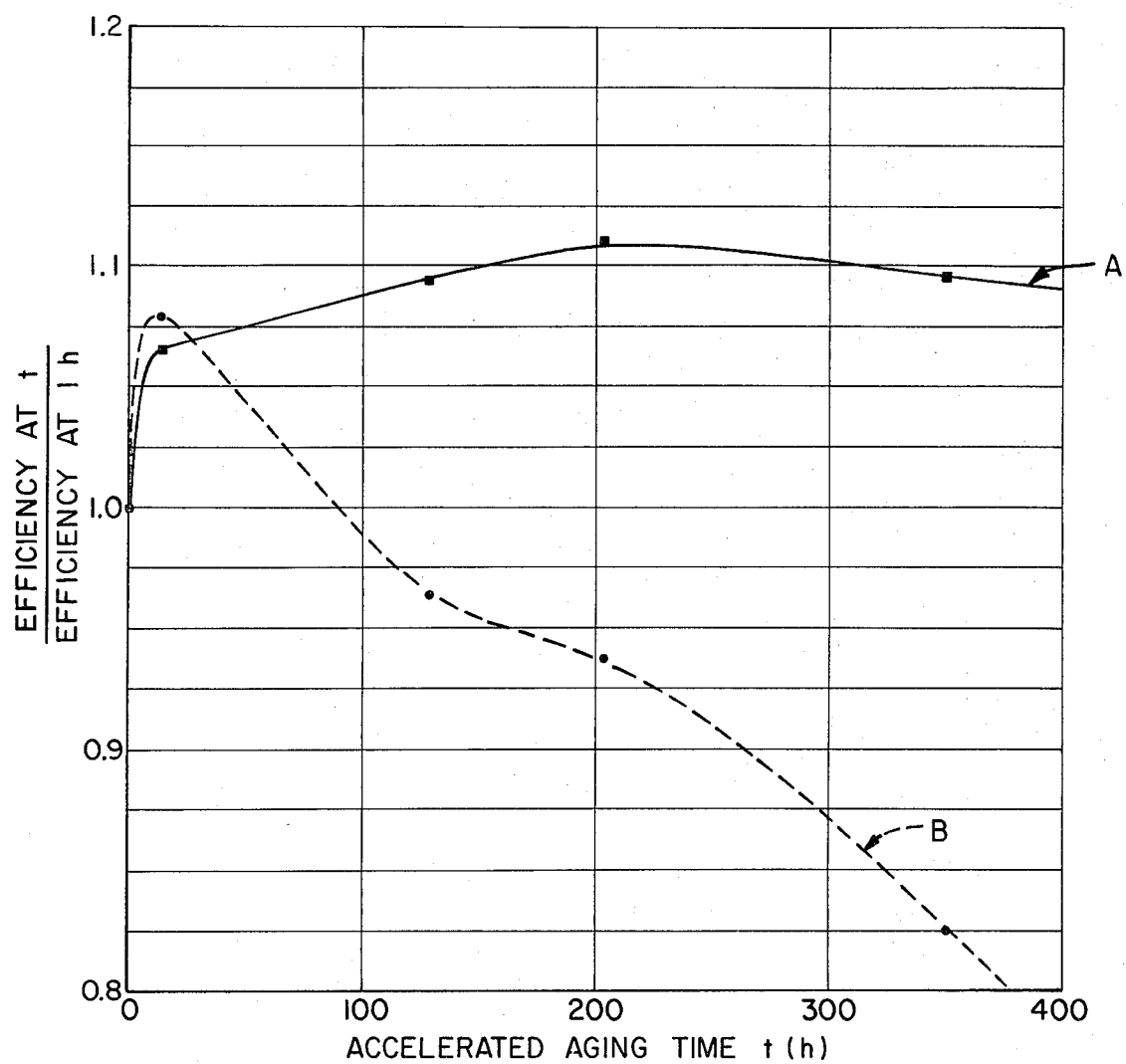
FIG. 3 is a plot of the results of Example 1, in which the abscissa is the time of an accelerated aging test of a cell and the ordinate is the ratio of efficiency of the cell at a given time to the efficiency at 1 hour. Curve A is an example of the present invention and curve B is a comparison example in which the present invention is not employed.

FIG. 3 shows the results of accelerated aging tests on a photovoltaic cell embodiment of the present invention (curve A) and a comparison cell not embodying the present invention (curve B). The tests at 350 hours are thought to represent about six months normal usage of the photovoltaic cells. FIG. 3 plots time, t, as the abscissa and the ratio of cell efficiency at time t to cell efficiency at one hour as the ordinate. The efficiency of a cell of the present invention is seen to be quite satisfactory over this aging test while that of the comparison cell is unsatisfactory.

PREFERRED METHOD OF FABRICATION

The preferred method of preparing the solar cells of this invention is to deposit the semiconducting layer and barrier layer onto a suitable conducting substrate, then to heat-treat the layers until the photovoltaic junction is formed. The stabilizing metal electrode is then deposited onto the barrier layer.

For example, in the $Cu_xS$-CdS solar cell, the CdS layer is deposited on indium oxide-coated glass. Then the $Cu_xS$ layer is formed by a topochemical reaction between CdS and CuCl solution. These layers are heat treated so as to achieve the correct stoichiometry of the $Cu_xS$ layer and to form the photovoltaic junction. Finally, the copper alloy is deposited onto the CuS layer. For this particular cell, a very low activity of copper is required to stabilize the $Cu_xS$ layer. Accordingly, the copper alloy contains very little copper. The preferred material is an alloy of copper and zinc, comprising one part of epsilon brass (4 parts copper to 1 part zinc) and 2 parts of eta zinc. This alloy has an activity within the desired range of $0.5-10^{-7}$, i.e., 0.21, as determined from thermodynamic data.

In a less preferred method, the semiconducting and barrier layers are deposited onto a suitable substrate, and the copper alloy is deposited before any heat treatment. In this case, the $Cu_xS$-CdS solar cell does not have the optimum stoichiometry of the $Cu_xS$ layer. Furthermore, the photovoltaic interface is not optimally formed, because there was no heat treatment prior to deposition of the copper alloy. Typically, the $Cu_xS$ formed topochemically has a value of x which is less than the desired value of 1.996. Therefore, a copper alloy having a higher activity than that in the preferred method described above must be deposited onto the $Cu_xS$. In this way, enough of the copper from the copper alloy will diffuse into the $Cu_xS$ layer during heat treatment and raise the stoichiometry to the desired value, and at the same time, the chemical activity of copper in the two phases becomes essentially the same.

An alternate to the latter procedure, and still less preferred, comprises depositing a thin film of copper onto the barrier layer of a fresh, non-heat treated cell. Then a subsequent layer of a copper alloy with a lower activity is deposited in the thin sheet of copper. Finally, the entire structure is heat treated, thereby driving the copper from the thin film into the barrier layer and into the alloy resulting in an activity balanced system wherein the $Cu_xS$ will have the value of x essentially equal to 1.998; and the activity stabilizing electrode will have an activity of about $1 \times 10^{-1}$.

In the examples to follow, the less preferred method of fabrication was used to prepare solar cells. Accordingly, the copper alloy electrodes used had a higher copper activity than is required in the preferred method.

EXAMPLES

The following examples are offered as illustrations of the preparation of thin film polycrystalline photovoltaic cells of improved stability or efficiency upon heating or aging in sunlight.

EXAMPLE 1

$Cu_xS$-CdS solar cells were prepared by depositing CdS films onto glass substrates which were previously covered with a thin layer of transparent tin-doped indium oxide. A thin film of $Cu_xS$ with a thickness of approximately 0.2 micrometer was then formed by topochemical conversion accomplished by placing the CdS film in a hot solution of CuCl. The resulting $Cu_xS$ film was then dried. Copper alloy electrodes were deposited onto selected areas of the $Cu_xS$ layer to form solar cells. On other selected areas, pure copper electrodes were deposited to form solar cells which would act as a control. The copper alloy electrode was prepared by placing a mixture of copper and zinc in a tungsten evaporation basket, then evaporating part of the mixture to produce an alloy layer approximately 2.0 micrometer thick. The molar ratio of Cu to Zn in the basket was 3 to 1, but owing to the higher volatility of Zn, the film first deposited on the $Cu_xS$ consisted of a mixture of epsilon brass and eta zinc.

The prepared solar cells were given an accelerated thermal aging stress to simulate aging over a long period of time. The aging stress consisted of an air heat treatment at 90° C. The cells were periodically removed from the heat treatment furnace and tested for photovoltaic efficiency and other solar cell properties. The accelerated aging at 90° C. is thought to represent an accelerated aging rate which is six times that in normal use of a flat plate solar cell. The accelerated aging study was continued for a period of 350 hours, representing a six-month equivalent exposure to normal use.

Results of the intermittent solar cell testing showed that the solar cells with pure copper electrodes had an increase in efficiency during the first 13 hours of accelerated aging stress, then the efficiency decreased steadily throughout the remaining 337 hours of the test. The rate of decrease in efficiency over the final period of the aging stress test was 4.05% per day. Thus, the equivalent rate of degradation of the efficiency in normal use was 20.2% per month of operation.

The solar cells with copper alloy electrodes were likewise intermittently tested during the accelerated thermal aging stress test. The results showed that this solar cell efficiency also increased during the first 13 hours of testing and thereafter it was nearly constant over the entire 350 hours of the test. Thus, the equivalent rate of degradation in normal use was essentially zero, and the cell efficiency would be expected to remain essentially constant.

These results are plotted in FIG. 3. In this figure, the hours of the accelerated test described above are plotted as the abscissa. The ordinate is a plot of the efficiency at any time, as compared to the efficiency after 1 hour. Curve A is obtained from the data points determined from the solar cell having the copper-zinc alloy electrode, and curve B is obtained from the data points determined for the solar cell having the copper electrode.

The above tests showed that the copper alloy stabilized the solar cells against degradation. The following explanation is proposed for the result obtained. When the copper and zinc were evaporated onto the surface, two Cu-Zn compounds were formed, such as epsilon brass and eta zinc. Together, these phases stabilized the activity of copper in the $Cu_xS$ layer. During the accelerated aging test, some copper was transferred to the $Cu_xS$ layer, owing to the fact that the copper activity in the alloy layer was higher than that in the $Cu_xS$ layer. For the solar cells prepared with pure copper electrodes, copper was again transferred from the copper layer to the $Cu_xS$ layer, causing an initial improvement in cell efficiency during the early part of the test, but then causing the $Cu_xS$ layer to become insulating during the latter part of the test as the barrier became largely $Cu_2S$.

EXAMPLE 2

Solar cells were prepared similar to those prepared in Example 1, except that the copper alloy deposited by thermal evaporation contained copper and lead. The test results showed that the solar cells containing the copper-lead alloy electrodes were shorted and had no photovoltaic efficiency.

This test shows that copper alloys containing elements such as lead, which readily form stable sulfides, are not desirable alloys for the proposed invention. By forming sulfides from the sulfur in the barrier layer, the relative activities of the copper in the barrier layer and in the electrode are upset and copper then migrates to form a short circuit because the alloying element removes sulfur (or another element) from the semiconducting layer, thereby causing undesirable changes in the semiconducting layer. When lead was used as an alloying element, lead sulfide was formed during heat treatment, thereby causing shorting of the cells.

EXAMPLE 3

Solar cells were prepared similar to those prepared in Example 1, except that tin was substituted for zinc in the copper alloy. The accelerated aging study showed that the efficiency of the solar cells containing the copper-tin alloy electrodes had an efficiency which was essentially constant with time, but which decreased very slowly during the aging study. The rate of change in efficiency was less than $10^{-3}\%$ per day of accelerated aging, or less than $10^{-2}\%$ per month in normal use.

Other solar cells were made in essentially the same way from copper and tin. When the mixture of copper and tin used to form the alloy electrode by evaporation contained copper and tin in a molar ratio of 3 to 1, the efficiency of the cells containing the alloy electrode increased by about $7 \times 10^{-4}\%$ per day of accelerated aging. When the mixture contained copper and tin in the molar ratio of 1 to 1, the resulting solar cells showed an efficiency which was constant during the accelerated aging period. When the mixture contained copper and tin in the molar ratio of 1 to 3, the resulting cells showed efficiencies which were nearly constant with time, but did increase by about $10^{-3}\%$ per day of accelerated aging. Nevertheless, the cell efficiencies of all cells containing copper-tin electrodes were nearly constant with time, within experimental error, showing that the copper alloy containing tin stabilized the cells against thermal degradation.

An explanation for the effectiveness of this copper alloy is that a mixture of copper-tin intermetallic compounds, such as the epsilon and eta phases, were codeposited, and that the coexistence of these phases stabilized the copper activity in the $Cu_xS$ layer.

EXAMPLE 4

Solar cells were prepared similar to those prepared in Example 1, except that the copper alloy contained copper and gold. The molar ratio of the evaporative mixture was 3 to 1. The test results showed that the solar cells containing the alloy electrodes had an efficiency which increased during the first hour of the accelerated aging test, but then decreased with continued time. At the end of the 350-hour test, the rate of decrease in efficiency was 2% per day of accelerated test, or about 10% per month in normal use.

The copper content of the evaporated copper alloy was approximately 75% or larger, owing to the comparable vapor pressures of copper and gold during evaporation. Thus, the copper activity of the resulting alloy electrode was much larger than desired, and nearly as large as that in a pure copper electrode (namely unity). Thus, the rate of degradation of the cells having copper-gold alloy electrodes of this high copper content was nearly as great as that for cells with pure copper electrodes.

EXAMPLE 5

The surprisingly effective age stabilizing improvement obtained with the stabilized metal electrodes in the photovoltaic cells of the present invention is illustrated by comparative experiments. In one set illustrating the prior art, the copper sulfide layer of the photovoltaic cell as described above is covered with a copper layer. In the other set, the copper sulfide layer is coated as before with copper and then with a further layer of tin. Each of the different sets illustrating the prior art and the present invention is further coated with a layer of gold to facilitate accurate electrical measurements and to protect the electrode from the atmosphere. This layer of gold is substantially an experimental convenience and would not be used in commercial cells. Currents and voltages under a constant light source were measured. The cells were then heated at about 200° C. for 3 minutes to effect the heat treatment. Again, the currents and voltages are measured. The results are given in the following table.

TABLE I

| Cell[1] Group | Before Heat Treatment | | | After Heat Treatment | | |
|---|---|---|---|---|---|---|
| | Current[2] $I_{sc}$ | Voltage[3] $V_{oc}$ | Eff. $\eta$ | Current[2] $I_{sc}$ | Voltage[3] $V_{oc}$ | Eff. $\eta$ |
| Copper Electrodes | | | | | | |
| 1 | 4.46 | 0.170 | 0.758 | 5.35 | 0.288 | 1.483 |
| 2 | 4.48 | 0.117 | 0.524 | 5.26 | 0.186 | 0.979 |
| 3 | 3.25 | 0.008 | 0.026 | 6.17 | 0.026 | 0.160 |
| Copper-Tin Electrodes | | | | | | |
| 1 | 5.46 | 0.305 | 1.667 | 5.00 | 0.372 | 1.860 |
| 2 | 4.38 | 0.226 | 0.989 | 4.30 | 0.263 | 1.132 |
| 3 | 6.46 | 0.195 | 1.259 | 6.31 | 0.219 | 1.382 |

[1]Cells differ in thickness of the cadmium sulfide layer from 25 micrometers to 13 micometers to 6 micrometers, respectively.
[2]Milliamperes, at short circuit.
[3]Volts, at open circuit.

The thin film polycrystalline photovoltaic cells of the present invention have been found to have improved stability compared to the usual photovoltaic cells of the prior art. The cell efficiency—that is, the ratio of electrical output power to solar energy input—is much more stable to heating or aging in sunlight.

These examples are offered to illustrate embodiments of this invention. It should be understood that the invention is to be given the broadest possible interpretation within the terms of the following claims.

What is claimed is:

1. A photovoltaic cell of improved stability comprising a barrier layer containing the metal $M_1$, one facial surface of said barrier layer being in contact with a layer of semiconductor material and forming a photovoltaic heterojunction therewith, and at least a portion of the other facial surface of said barrier layer in intimate contact with a stabilizing metal electrode;
   wherein said stabilizing metal electrode is an alloy comprised of at least two metallic elements, one of which is $M_1$, such that the tendency of $M_1$ to diffuse between said stabilizing metal electrode and said barrier layer is approximately zero.

2. A photovoltaic cell according to claim 1 wherein said stabilizing metal electrode is comprised of a two-phase mixture of two or more metallic compositions which are solid solutions or intermetallic compounds wherein one of said compositions contains $M_1$ and the remaining compositions contain metals not in the barrier layer.

3. A photovoltaic cell as in claim 1 wherein $M_1$ is selected from metals of Groups IB, IIB, IIIA and IIIB, IVA and IVB, VB and VIB of the Periodic Table.

4. A photovoltaic cell as in claim 1 wherein $M_1$ is selected from copper, zinc and boron.

5. A photovoltaic cell as in claim 1, wherein the stabilizing electrode comprises, in addition to $M_1$, metals selected from the group consisting of strontium, barium, tin, lead, antimony, bismuth, manganese, and the Group IB, IIB, IIIA and IIB, IVB, VB and VIB metals.

6. A photovoltaic cell as in claim 1, wherein the stabilizing electrode is comprised of alloys chosen from the group comprising copper-zinc, copper-aluminum, copper-tin, copper-gold, zinc-cadmium, zinc-silver, zinc-tin, copper-nickel-aluminum, copper-zinc-tin and zinc-cadmium-gold.

7. A photovoltaic cell of improved stability according to claim 1 wherein $M_1$ is copper, said semiconductor layer is cadmium sulfide, said barrier layer is copper sulfide, and said stabilizing metal electrode is comprised of a copper alloy or mixtures of copper alloys, such that the copper has a standard chemical activity in the range of $1 \times 10^{-7}$ to $5 \times 10^{-1}$.

8. A photovoltaic cell according to claim 7, wherein the stabilizing electrode is comprised of metallic elements selected from the group consisting of copper-zinc, copper-aluminum, copper-tin, copper-gold, copper-nickel-aluminum and copper-zinc-tin.

9. A photovoltaic cell of improved stability according to claim 7 wherein said copper sulfide is $Cu_xS$ and x has a value greater than 1.99 and less than 2.0.

10. A photovoltaic cell of improved stability according to claim 7 wherein said stabilizing metal electrode contains a metal element selected from Groups IIB, IIIA and IIIB, and IVA, excluding Pb, of the Periodic Table.

11. A photovoltaic cell of improved stability according to claim 7 wherein said stabilizing metal electrode is comprised of copper and tin.

12. A photovoltaic cell of improved stability according to claim 7 wherein said stabilizing metal electrode is comprised of copper and zinc.

13. The photovoltaic device according to claims 1, 3, 5, 6, or 12 wherein the barrier layer is selected from the group consisting of $Cu_xS$, $CdTe-Cu_xTe$, $Cu_xInSe_2$, $Cu_xInTe_2$, $Cu_xGaTe_2$, $Cd_xSiAs_2$, $Zn_xSiAs_2$, and $B_xAs$.

14. A photovoltaic cell of improved stability comprising a barrier layer containing the metal $M_1$, one facial surface of said barrier layer being in contact with a layer of semiconductor material and forming a photovoltaic heterojunction therewith, and the other facial surface of said barrier layer in intimate contact with a stabilizing metal electrode;
wherein said stabilizing metal electrode comprises an alloy of at least two metallic elements, one of which is $M_1$, such that the net diffusion of $M_1$ between said stabilizing electrode and said barrier layer is approximately zero.

15. A method of fabricating a stabilizing electrode on a photovoltaic cell which comprises a barrier layer containing a metal $M_1$ contacting a facial surface of a semiconductor layer and forming a photovoltaic heterojunction therewith and at least a portion of the opposite facial surface of said barrier layer contacting an electrode, said method comprising: fabricating said electrode as a stabilizing electrode comprising an alloy of at least two metallic elements, wherein one of the elements $M_1$ is in the barrier layer and in the stabilizing electrode layer such that the tendency of $M_1$ to diffuse between said stabilizing electrode and said barrier layer is approximately 0.

16. The method according to claim 15 wherein said stabilizing electrode is formed by evaporation.

17. The method according to claim 16 wherein the metallic elements of said stabilizing electrode are evaporated together.

18. The method according to claim 17 wherein the stabilizing electrode comprises copper and a metal element selected from the periodic table Groups IIB; IIIA; IIIB; and IVA, excluding Pb.

19. The method according to claim 16 wherein the metallic elements of said stabilizing electrode are evaporated separately and then the photovoltaic cell is heat-treated to alloy said metals into said stabilizing electrode.

20. The method according to claim 16 wherein said stabilizing electrode is comprised of a copper alloy or mixtures of copper alloys wherein the standard chemical activity of the copper is adjusted in the range of from $1 \times 10^{-7}$ to $5 \times 10^{-1}$.

* * * * *

UNITED STATES PATENT AND TRADEMARK OFFICE
CERTIFICATE OF CORRECTION

PATENT NO. : 4,366,336
DATED : December 28, 1982
INVENTOR(S) : Lee F. Donaghey

It is certified that error appears in the above-identified patent and that said Letters Patent are hereby corrected as shown below:

Col. 10, Table I, line 23, "micometers" should read --micrometers--.

Col. 10, Claim 5, line 65, "IIIA and IIB, should read --IIIA and IIIB,--.

Signed and Sealed this

Ninth Day of October 1984

[SEAL]

Attest:

GERALD J. MOSSINGHOFF

Attesting Officer

Commissioner of Patents and Trademarks